(12) United States Patent
Kwon et al.

(10) Patent No.: US 7,719,167 B2
(45) Date of Patent: May 18, 2010

(54) ELECTROACTIVE POLYMER ACTUATOR AND MANUFACTURING METHOD THEREOF

(75) Inventors: Jong-oh Kwon, Suwon-si (KR);
Seung-tae Choi, Osan-si (KR);
Seung-wan Lee, Suwon-si (KR);
Woon-bae Kim, Suwon-si (KR);
Min-seog Choi, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 95 days.

(21) Appl. No.: 11/927,827

(22) Filed: Oct. 30, 2007

(65) Prior Publication Data

US 2008/0284277 A1     Nov. 20, 2008

(30) Foreign Application Priority Data

May 14, 2007    (KR) .................. 10-2007-0046542

(51) Int. Cl.
*H01L 41/08*    (2006.01)

(52) U.S. Cl. ...................... 310/328; 310/309

(58) Field of Classification Search ............... 310/330, 310/363, 364, 800, 328, 307, 324, 367, 368, 310/369; 333/187, 189
See application file for complete search history.

(56) References Cited

U.S. PATENT DOCUMENTS

| | | | |
|---|---|---|---|
| 6,960,864 B2* | 11/2005 | Urano et al. | 310/307 |
| 7,456,709 B2* | 11/2008 | Jung et al. | 310/367 |
| 2002/0140321 A1* | 10/2002 | Waterfield | 310/330 |

* cited by examiner

*Primary Examiner*—Walter Benson
*Assistant Examiner*—Karen B Addison
(74) *Attorney, Agent, or Firm*—Sughrue Mion, PLLC

(57) ABSTRACT

An electroactive polymer actuator and a method for manufacturing the electroactive polymer actuator are provided. The electroactive polymer actuator includes an actuator unit which is a laminate of a plurality of deformation layers; and a support layer which supports the actuator unit so that the actuator unit provides displacement corresponding to a voltage if the voltage is applied to the actuator unit. Therefore, it is possible to provide an electroactive polymer actuator suitable for a compact mobile device with a low driving voltage.

21 Claims, 6 Drawing Sheets

ELECTROACTIVE POLYMER ACTUATOR AND MANUFACTURING METHOD THEREOF

CROSS-REFERENCE TO RELATED APPLICATIONS

This application claims priority from Korean Patent Application No. 10-2007-0046542, filed on May 14, 2007, in the Korean Intellectual Property Office, the disclosure of which is incorporated herein by reference in its entirety.

BACKGROUND OF THE INVENTION

1. Field of the Invention

Apparatuses and methods consistent with the present invention relate to manufacturing an electroactive polymer actuator, and more particularly, to manufacturing an electroactive polymer actuator using deformation layers having a multilayer structure.

2. Description of the Related Art

Recently, actuator technologies using electroactive polymers (EAPs) have become widespread, and EAPs are often referred to as artificial muscle actuators due to the similarities with human muscles.

EAPs are polymers whose shape is modified when electronic stimulation is is applied to them. They can be used a sactuators or sensors. Polymers can be actuated not only by electronic stimulation, but also bychemical stimulation, heat, or other types of stimulation. EAPs can have several configurations, but are generally divided in two principal calsses: (1) electronic EAPs, in which actuation is caused by electrostatic forces between two electrodes whci squeeze the plymer (e.g., dielectric elastomers and electrostrictive polymers); and (2) ionic EAPs, in which actuation is caused by the displacement of ions insider the polymer. Examples of ionic EAPs are ionic polymer metal composites (IPMCs), conductive polymers, ionic polymer gels, polyvinylidene fluoride (PVDF), carbon nanotubes, and shape memory polymers. Some of EAPs are actuated in a liquid such as a chemical solvent and others are actuated in the air by electric energy.

Increasingly, there are efforts to reduce the size, mass, and power of actuators as well as use them to operate biologically inspired devices. Electroactive ceramic actuators (for example, piezoelectric and electrostrictive) are effective, compact actuation materials and they are used to replace electromagnetic motors. However, while these materials are capable of delivering large forces, they produce a relatively small displacement on the order of magnitude of fraction of a percent. For high-performance camera modules suitable for mobile devices, which have auto-focus and zoom functions, actuators of large displacement are required. A conventional ceramic piezoelectric actuator can be deformed to reach the maximum ratio of deformation of 0.1%, but a polymer actuator is capable of reaching approximately 5%. However, during the operation of the a polymer actuator, a difference in the deformation of an elastomer and the deformation of a metal electrode causes delamination or performance degradation, which in turn is detrimental to reliability of the product. Additionally, in order to maintain the performance of the polymer actuator while reducing the driving voltage, there is a need for technologies to laminate thin actuators into a multilayer structure.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides an electroactive polymer actuator and a method for manufacturing the electroactive polymer actuator, in which deformation layers have a multilayer structure, so that a driving voltage can be reduced while maintaining the performance of the actuator.

According to an aspect of the present invention, there is provided an electroactive polymer actuator including an actuator unit which is configured to have a laminate of a plurality of deformation layers; and a support layer which supports the actuator unit, wherein the actuator unit provides displacement corresponding to a voltage when the voltage is applied to the actuator unit.

The actuator unit may include a plurality of electrode layers, and the electrode layers and the deformation layers are alternately disposed and the electrode layers provide the voltage to the deformation layers.

At least one of the plurality of electrode layers may include a conductive polymer.

The actuator unit may further include a plurality of insulating layers which are disposed on one side of the plurality of deformation layers.

At least one of the plurality of electrode layers may be formed of a polyaniline (PANI) or poly(3,4-ethylenedioxythiophene)/poly(styrenesulfonate) (PEDOT/PSS), which is patterned.

A part of a respective layer of the plurality of deformation layers may be in contact with the electrode layers and the other part of the respective deformation layer is in contact with the insulating layers.

The plurality of deformation layers may include a dielectric polymer.

The support layer may include an inactive polymer.

The plurality of deformation layers may include a dielectric elastomer such as silicone or acrylate elastomer.

The plurality of deformation layers may include a ferroelectric polymer, such as a polyvinylidene fluoride (PVDF) or polyvinylidene fluoride-trifluoroethylene [P(VDF-TrFE)].

The plurality of deformation layers may include a relaxor ferroelectric polymer, such as a poly(vinylidene fluoride-trifluoroethylene-chlorofluoroethylene) [P(VDF-TrFE-CFE)].

According to another aspect of the present invention, there is provided a method for manufacturing an electroactive polymer actuator, the method including forming an actuator unit by laminating a plurality of deformation layers on a substrate, wherein the deformation layers undergo displacement when a voltage is applied to the actuator unit; and forming a support layer which supports the actuator unit, wherein the actuator unit provides displacement corresponding to a voltage when the voltage is applied to the actuator unit.

The forming the actuator unit may include alternately laminating a plurality of electrode layers and a plurality of deformation layers on the substrate.

The forming the actuator unit may further include forming a plurality of insulating layers on one side of the plurality of deformation layers.

The forming the support layer may include coating the substrate, on which the actuator unit is formed, with a material forming the support layer; and removing the substrate.

The method may further include repeating the steps of forming the actuator unit and forming the support layer a plurality of times, to manufacture a plurality of actuators; and combining the plurality of actuators into a single structure, wherein the support layer of the plurality of actuators of the single structure face each other and are in contact with each other.

At least one of the plurality of electrode layers may be formed by patterning a polyaniline (PANI) or poly(3,4-ethylenedioxythiophene)/poly(styrenesulfonate) (PEDOT/PSS).

A part of a respective layer of the plurality of deformation layers may be in contact with the electrode layers and the other part of the respective deformation layer is in contact with the insulating layers.

The plurality of deformation layers may comprise a dielectric polymer.

The support layer may include an inactive polymer.

The plurality of deformation layers may include a dielectric elastomer such as a silicone or acrylate elastomer.

The plurality of deformation layers may include a ferroelectric polymer, such as a polyvinylidene fluoride (PVDF) or polyvinylidene fluoride-trifluoroethylene [P(VDF-TrFE)].

The plurality of deformation layers may include a relaxor ferroelectric polymer, such as a poly(vinylidene fluoride-trifluoroethylene-chlorofluoroethylene) [P(VDF-TrFE-CFE)].

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF EXEMPLARY EMBODIMENTS

Figure 1A:
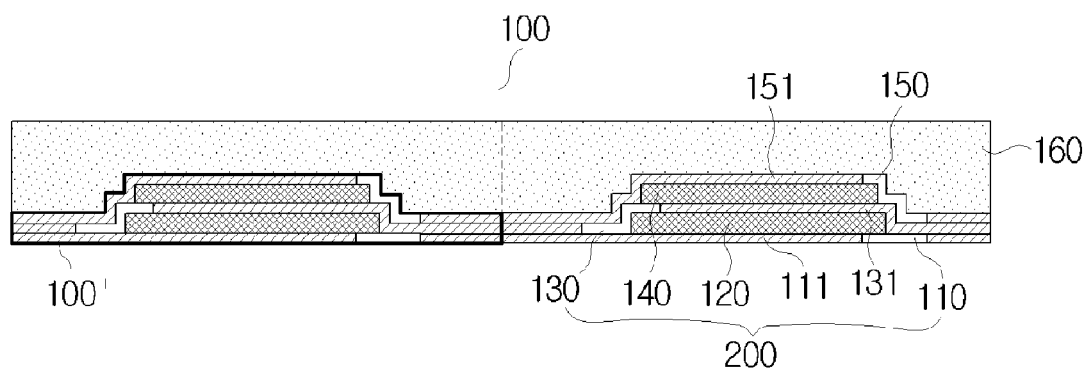
FIG. 1A is a vertical sectional view of an electroactive polymer actuator according to an exemplary embodiment of the present invention and FIG. 1B is an enlarged vertical sectional view of an individual electroactive polymer actuator, which is in a chip form, as shown in FIG. 1A.

Certain exemplary embodiments of the present invention will now be described in greater detail with reference to the accompanying drawings.

In the following description, same drawing reference numerals are used for the same elements even in different drawings. The matters defined in the description, such as detailed construction and elements, are provided to assist in a comprehensive understanding of the invention. Thus, it is apparent that the exemplary embodiments of the present invention can be carried out without those specifically defined matters. Also, well-known functions or constructions are not described in detail since they would obscure the invention with unnecessary detail.

FIG. 1A is a vertical sectional view of an electroactive polymer (EAP) actuator according to an exemplary embodiment of the present invention. In FIG. 1A, an EAP actuator 100 according to an exemplary embodiment of the present invention comprises a first electrode layer 111, a first insulating layer 110, a first deformation layer 120, a second electrode layer 131, a second insulating layer 130, a second deformation layer 140, a third electrode layer 151, a third insulating layer 150, and a support layer 160.

EAP actuators may be variously utilized, such as autofocus (AF)/zoom lenses, polymer micro-electro-mechanical systems (MEMS), and biology, and in particular, may be used to implement AF, zoom and optical image stabilization (OIS) functions.

EAPs which may be employed in the present invention are electronic EAPs and the present specification provide descriptions with respect to a dielectric elastomer or an electrostrictive polymer. It shoud be noted, however, that other types of electronic EAPs also may be used.

The EAP actuator 100 comprises an actuator unit 100' comprising the first electrode layer 111, first insulating layer 110, first deformation layer 120, second electrode layer 131, second insulating layer 130, second deformation layer 140, third electrode layer 151 and third insulating layer 150, and a support layer 160.

The actuator unit 100' may provide displacement corresponding to a voltage applied to the EAP. In other words, the EAP is actuated according to the of the applied voltage.

Figure 1B:
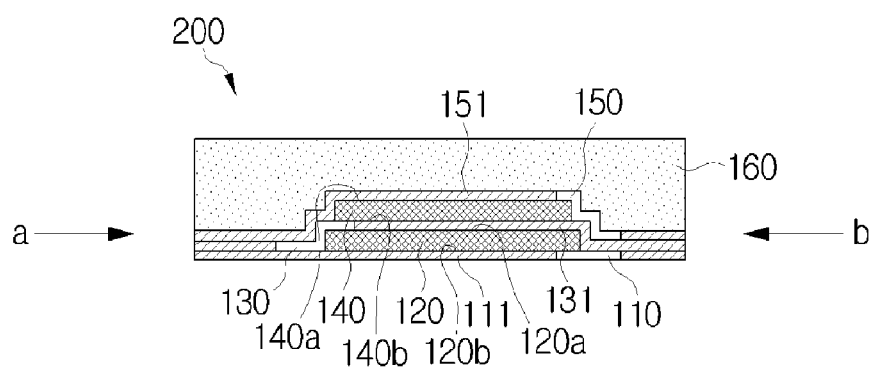

The actuator unit 100' has a multilayer structure in which the first deformation layer 120 and the second deformation layer 140 are laminated. As shown in FIG. 1B, The first deformation layer 120 and the second deformation layer 140 each have a first surface 120a and 140a, respectively and a second surface 120b and 140b, respectively, each are opposite to the first surface 120a and 140a. The first electrode layer 111 and the third electrode layer 151 are disposed in a way to sandwich the first deformation layer 120 and the second deformation layer 140, and the second electrode layer 131 is interposed between the first deformation layer 120 and the second deformation layer 140. Thus, in the current embodiment, the first electrode layer 111 is in contact with the second surface 120b of the first deformation layer 120 and the third electrode layer 151 is in contact with the first surface 140a of the second deformation layer 140. And, the second electrode layer 131 is in contact with both of the first surface 120a of the first deformation layer 120 and the second surface 140b of the second deformation layer 140. The actuator unit 100' also include the first insulating layer 110 and the third insulating layer 150, which are disposed on one side of the first electrode layer 111 and the third electrode layer 151, respectively, and, each are in contact with an end portion of the second surface 120b of the first deformation layer 120 and with an end portion of the first surface 140a of the second deformation layer 140. On the other hand, the second insulating layer 130 is disposed on one side of the second electrode layer 131 and in contact with an end portion of the first surface 120a of the first deformation layer 120 and an end portion of the second surface 140b of the second deformation layer 140. The end portion of the first deformation layers 120 and 140, where they are in contact with the insulating layers 110 and 150 is opposite to their other end portion where they are in contact with the second insulating layer 130. Thus, the voltage applied to the first and third electrode layers have an opposite direction to the voltage applied to the second electrode layers. The first electrode layer 111, the second electrode layer 131 and the third electrode layer 151 may receive the voltage to induce the deformation of the first deformation layer 120 and the second deformation layer 140, and may be formed of conductive polymers. If the first electrode layer 111, the second electrode layer 131 and the third electrode layer 151 are formed of conductive polymers, it is possible to prevent a delamination phenomenon which may occur between deformation layers and metal electrodes. Additionally, in order to produce an actuator 100 suitable for use in a camera module for a mobile device or the like, it is necessary to reduce the driving voltage of the actuator 100. If the first deformation layer 120 and the second deformation layer 140 are thinly formed in order to reduce the driving voltage, metal electrodes may increasingly inhibit the deformation layers from being strained. Accordingly, a conductive polymer having a low elastic modulus may be used advantageously as an electrode.

However, the third electrode layer 151 in contact with the support layer 160 may support the actuator unit 100'. The third electrode layer 151 may not interfere with actuation of the actuator unit 100', so the third electrode layer 151 may be formed of a metal.

The first electrode layer 111, the second electrode layer 131 and the third electrode layer 151 may comprise a polymer material such as a polyaniline (PANI) or poly(3,4-ethylenedioxythiophene)/poly (styrenesulfonate) (PEDOT/PSS), which has a high electrical conductivity.

In the case of using PANI, non-conductive PANI is coated onto a substrate, and ultraviolet (UV) rays are partially irradiated to the coated substrate, so that the first electrode layer 111, the second electrode layer 131 and the third electrode layer 151 can be formed. In other words, patterning is performed using the properties of PANI, in which a region of the substrate which is not exposed to UV rays is maintained in a non-conductive state and a region of the substrate which is exposed to UV rays is changed from a non-conductive state to a conductive state. A process for patterning a PANI layer will be described in detail later with reference to a method for manufacturing the EAP actuator.

In the case of PEDOT/PSS, a domain to which UV rays are not irradiated may be maintained in a conductive state, and a domain to which UV rays are irradiated may lose conductivity, and accordingly, patterning may be performed in similar manner to the process for patterning PANI.

If the voltage is applied through the first electrode layer 111, the second electrode layer 131 and the third electrode layer 151, the first deformation layer 120 and the second deformation layer 140 may be electrically deformed, so that displacement corresponding to the applied voltage can be provided.

The first deformation layer 120 and the second deformation layer 140 may be in contact with the first electrode layer 111, the second electrode layer 131 and the third electrode layer 151, and with the first insulating layer 110, the second insulating layer 130 and the third insulating layer 150, simultaneously.

The first deformation layer 120 and the second deformation layer 140 may comprise incompressible dielectric polymer materials.

Specifically, a dielectric elastomer, such as silicone or acrylate, may be used as the first deformation layer 120 and the second deformation layer 140.

Alternatively, a ferroelectric polymer, such as polyvinylidene fluoride (PVDF) or polyvinylidene fluoride-trifluoroethylene [P(VDF-TrFE)], may be used as the first deformation layer 120 and the second deformation layer 140.

Alternatively, a relaxor ferroelectric polymer, such as poly (vinylidene fluoride-trifluoroethylene-chlorofluoroethylene) [P(VDF-TrFE-CFE)], may be used as the first deformation layer 120 and the second deformation layer 140.

There is a slight difference in the methods for driving actuators between the case in which a dielectric elastomer, such as silicone or acrylate, is used as the first deformation layer 120 and the second deformation layer 140, and the case in which a ferroelectric polymer, such as PVDF or P(VDF-TrFE), or a relaxor ferroelectric polymer, such as P(VDF-TrFE-CFE), are used as the first deformation layer 120 and the second deformation layer 140. Accordingly, a detailed description thereof will be given later with reference to FIG. 1B.

The first insulating layer 110, the second insulating layer 130 and the third insulating layer 150 enable the first electrode layer 111, the second electrode layer 131 and the third electrode layer 151 to be selectively connected therebetween, and allow the first electrode layer 111, the second electrode layer 131 and the third electrode layer 151 to function as a pair of electrodes in the actuator unit 100'.

The first insulating layer 110, the second insulating layer 130 and the third insulating layer 150 may be formed by patterning. For example, UV rays are applied to the regions of the non-conductive PANI layer to form the first electrode layer 111, the second electrode layer 131 and the third electrode layer 151. A process for forming the first insulating layer 110, the second insulating layer 130 and the third insulating layer 150 will be described in detail hereinafter with reference to the method for manufacturing the EAP actuator.

If the voltage is applied to the actuator unit 100', the support layer 160 may support the actuator unit 100' so that the actuator unit 100' can provide displacement corresponding to the applied voltage. The support layer 160 may be formed of an inactive polymer capable of supporting deformation of the actuator unit 100'.

FIG. 1B is an enlarged vertical sectional view of an actuator unit as shown in FIG. 1A. As shown in FIGS. 1A and 1B, the actuator of FIG. 1A may be formed to have multiple actuator units and it can be divided into an individual actuator in a form of chip.

In FIG. 1B, an actuator 200 is driven by a voltage applied in direction "a" and direction "b."

The first electrode layer 111 is electrically connected to the third electrode layer 151 on one end of the actuator unit through conductive layers laminated between them, while is not electrically connected to the third electrode layer 151 on the opposite end of the actuator unit, which allows a voltage applied to the first and third electrode layers 111 and 151 will have a direction "a," while a voltage applied to the second electrode layer 131 has an opposite direction "b." The first and third electrode layers 111 and 151 will function as an electrode which has a same direction to that of an external electrode (not shown) connected to them. In FIG. 1B, the first and the third electrode layers have the direction "a." Additionally, the second electrode layer 131 has a same current direction to that of an external electrode (not shown) connected to the second electrode layer. In FIG. 1B, the second electrode layer has a direction "b." For example, if a positive electrode is connected in direction "a," and if a negative electrode is connected in direction "b," the first electrode layer 111 and the third electrode layer 151 become functioning as a positive electrode, and the second electrode layer 131 become functioning as a negative electrode. In this situation, an electric field generated by the voltage applied to the positive and negative electrodes induces the strain in the first deformation layer 120 and the second deformation layer 140.

Specifically, a lower part of the actuator unit 100' is vertically expanded due to a vertical expansion of the first deformation layer 120 and the second deformation layer 140, and an upper part of the actuator unit 100' is supported by the support layer 160, and thus, the actuator unit 100' may be driven while the shape thereof is being modified in a form of "concave".

In other words, when a positive electrode and a negative electrode are alternatively connected to the respective first electrode layer 111, the second electrode layer 131 and the third electrode layer 151, a certain electric field may be generated in the first deformation layer 120 and the second deformation layer 140, inducing deformation of the first and the second deformation layers 120 and 140.

The first deformation layer 120 and the second deformation layer 140 may be in contact with the first electrode layer 111, the second electrode layer 131 and the third electrode layer 151, and with the first insulating layer 110, the second insulating layer 130 and the third insulating layer 150 simultaneously, and may have a stepped form. In other words, a length of the first deformation layer 120 may be greater than that of the second deformation layer 140.

If a dielectric polymer, such as silicone or acrylate, is used as the first deformation layer 120 and the second deformation layer 140, the actuator may be driven by the deformation caused by the electrostatic force. A ratio of deformation is obtained using a quadratic function of the driving voltage, and may have a large driving displacement (a maximum ratio of deformation of approximately 380%).

If an electrostrictive polymer, for example a ferroelectric polymer such as PVDF or P(VDF-TrFE), or the relaxor ferroelectric polymer such as P(VDF-TrFE-CFE), is used as the first deformation layer 120 and the second deformation layer 140, the actuator may be driven by the deformation due to the electrostriction phenomenon.

Electron irradiation or a chlorofluoroethylene (CFE) monomer transforms a polarization domain of P(VDF-TrFE), a ferroelectric polymer, into numerous nanopolar domains, resulting a conversion of the P(VDF-TrFE) into P(VDF-TrFE-CFE), which is a relaxor ferroelectric polymer.

If the first deformation layer 120 and the second deformation layer 140 are formed of the electrostrictive polymer as described above, deformation may be generated due to the electrostriction phenomenon. The electrostriction phenomenon refers to situation in which the displacement occurs as a quadratic function with respect to an electric field and increased displacement is exhibited at a temperature greater than the Curie temperature. The electrostriction phenomenon has the benefit that hysteresis loops are barely visible at a temperature of the paraelectric phase, so it is possible to apply the electrostriction to microscopic displacement elements of an optical device such as a laser or a camera.

Hereinafter, the Maxwell stress is represented by Equations 1 and 2, which explain the relationship between the driving voltage (V) and the thickness (d) of the first deformation layer 120 and second deformation layer 140.

$$\sigma_{33} = \frac{\varepsilon_r \varepsilon_0 V^2}{2d^2} \quad \text{[Equation 1]}$$

$$e_{11} = e_{22} = \frac{V}{E}\sigma_{33} = \frac{v\varepsilon_r \varepsilon_0 V^2}{2Ed^2} \quad \text{[Equation 2]}$$

In the equations, "$\varepsilon_r$" is relative permittivity of elastomer, "$\varepsilon_0$" is electrical permittivity of vacuum, σ is stress, e is strain, E is electric modulus, V is applied voltage, d is thickness of elastomer, and v is poisson's ratio of elastomer. As shown in Equations 1 and 2, the thickness of the first deformation layer 120 and second deformation layer 140 is proportional to the driving voltage. Accordingly, in order to set the driving voltage to be equal to or lower than 100V, which is a suitable level for a camera module, the first deformation layer 120 and the second deformation layer 140 need to be thin.

Specifically, the first deformation layer 120 and the second deformation layer 140 may have a thickness of approximately 0.5 to 20 μm, respectively, and the first electrode layer 111, the second electrode layer 131 and the third electrode layer 151 may have a thickness of approximately 0.1 to 2 μm, respectively. Here, in order not to interfere with the actuation of the first deformation layer 120 and second deformation layer 140, the first electrode layer 111, the second electrode layer 131 and the third electrode layer 151 may have a thickness approximately 1/10 times that of the first deformation layer 120 and the second deformation layer 140, respectively. The support layer 160 may have a thickness of approximately 2 to 50 μm, and the total thickness of the actuator 100 may be approximately 50 to 100 μm.

Hereinafter, the method for manufacturing the EAP actuator shown in FIGS. 1A and 1B will be explained. In particular, a patterning process using a conductive polymer as an electrode layer is required in order to perform the process at one time, so description will be given based on the patterning method. For convenience of description, PANI is used as an electrode layer in the exemplary embodiment of the present invention.

A method for patterning PANI generally comprises a photoactive process, a normal photo process, and an inkjet printing process.

During the photoactive process, photosensitive PANI is used, and PANI coating, exposing and developing operations are performed. Additionally, the photoactive process is advantageous in that it provides a user with a flexibility of choosing apparatuses and improves productivity. On the other hand, the use of photo active compound may cause a relatively low electrical conductivity.

The normal photo process is a patterning process using a photoresist (PR). During the normal photo process, a relatively high electrical conductivity may be exhibited and a wafer fabrication process allows a user to have flexibility in choosing apparatuses and increases productivity. However, the normal photo process is disadvantageous that the fabrication of each layer requires five operations, such as PANI coating, PR coating, PR exposing, developing and PANI etching.

During the inkjet printing process, a relatively high electrical conductivity may be exhibited, and only a single operation (PANI inkjet printing) is performed to form each layer. However, the PANI etching can be performed in only a specific apparatus and is performed in cell units, and accordingly its productivity is lower than the wafer unit process.

In order to ease the understanding of description, a situation in which the photoactive process of the method for patterning PANI as described above is applied to the exemplary embodiment of the present invention will be explained.

FIGS. 2A to 2K are views showing the process of manufacturing the EAP actuator shown in FIGS. 1A and 1B.

Figure 2A:
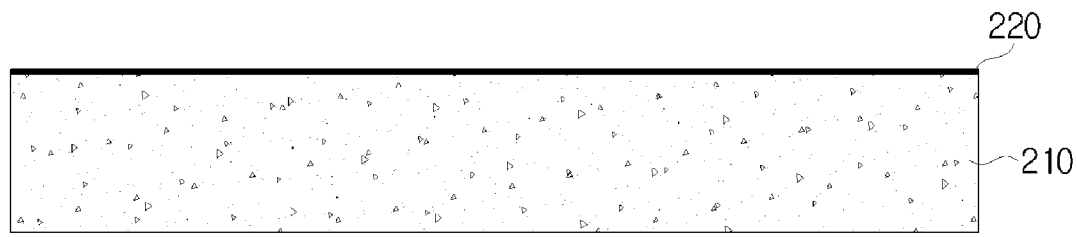
FIGS. 2A to 2K are views showing operations of a method for manufacturing the electroactive polymer actuator shown in FIGS. 1A and 1B.

As shown in FIG. 2A, a coating layer 220 for preventing stiction is formed on a substrate 210. Examples of the substrate 210 include plate glass, a wafer, or a sheet-like substrate.

Figure 2B:
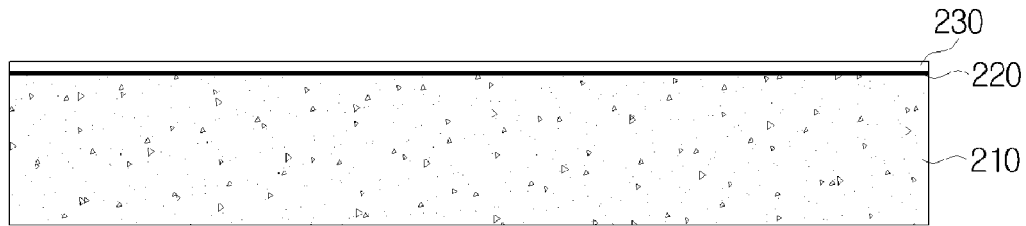

As shown in FIG. 2B, a first PANI layer 230 is formed on the coating layer 220.

Figure 3A:
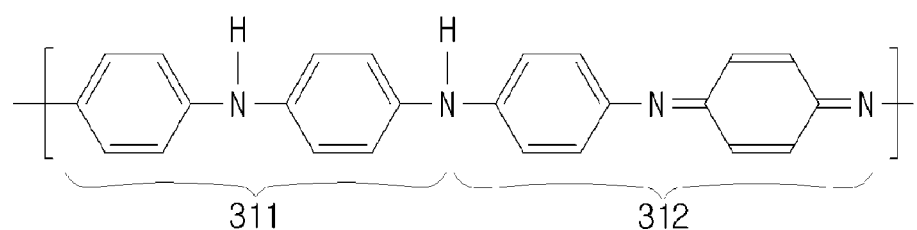
FIGS. 3A to 3C are examples of polymer compounds employed in the process of FIGS. 2A to 2K.

Generally, aniline is oxidatively polymerized using an oxidant, such as ammonium persulfate $((NH_4)_2S_2O_8)$ or potassium perchlorate $(KClO_4)$, to obtain PANI. FIG. 3A shows a structural formula of PANI. As shown in FIG. 3A, PANI has an oxidative moiety 311 and a reductive moiety 312.

Figure 3B:
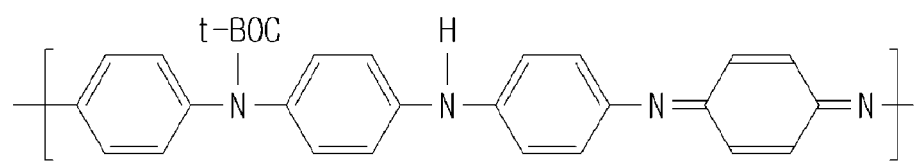

As predicted from its structure, it is difficult to dissolve PANI in an organic solvent, alcohol, water or the like. Accordingly, in order to increase dissolution of PANI in a solvent to produce a liquid PANI, PANI is reacted with di-tert-butyl dicarbonate (DTBDC) in a solvent, for example, N-methyl- 2-pyrrolidone (NMP). As a result of the reaction, a soluble PANI substituted with mono-t-butoxycarbonyl (t-BOC) is obtained, as shown in FIG. 3B.

In the step of FIG. 2B, the first PANI layer 230 is formed using the soluble PANI substituted with mono-t-BOC. The PANI substituted with mono-t-BOC has four peaks between approximately 139.5 ppm and 160 ppm of chemical shifts in the solution state in 13C NMR spectrum, and has no conductivity.

Figure 2C:
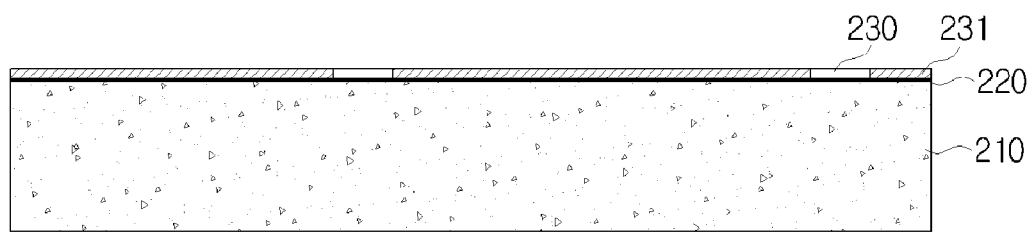

Subsequently, in FIG. 2C, the first PANI layer 230 is patterned so as to be divided into a first electrode layer 231 and a first insulating layer 230.

Specifically, a patterning mask, which has a first region in which the first electrode layer 231 may be formed and a second region in which the first insulating layer 230 may be formed, is brought into contact with a surface of the first PANI layer 230. Subsequently, if UV rays are irradiated, the first region to which UV rays are irradiated may be changed from a non-conductive state to a conductive state to form the first electrode layer 231, and the second domain which UV rays are not irradiated may be maintained in a non-conductive state to form the first insulating layer 230.

Figure 3C:

FIG. 3C shows a structural formula of PANI in a conductive state. In other words, FIG. 3C shows the PANI of the region of the first PANI layer 231 to which UV rays are irradiated to convert non-conductive PANI to conductive PANI. As shown in FIG. 3C, when PANI of the structural formula of FIG. 3B (i.e., non-conductive state) is reacted with a photosensitizing agent such as a PAC or a photo-acid generator (PAG), exposed to UV rays, followed by a post exposure bake (PEB), it is changed to emeraldine salts having conductivity. Since all photosensitizing agents have a conjugation structure in which single and double bonds are alternated, they may absorb UV energy.

Figure 2D:
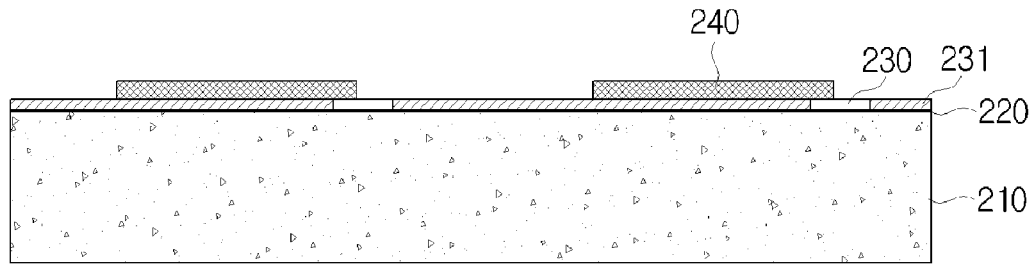

As shown in FIG. 2D, a first deformation layer 240 is formed so as to be in contact with both of the first electrode layer 231 and the first insulating layer 230. The first deformation layer 240 may be formed of an organic polymer material. Specifically, examples of the first deformation layer 240 include a dielectric elastomer such as silicone or acrylate, a ferroelectric polymer such as PVDF or P(VDF-TrFE), and a relaxor ferroelectric polymer such as P(VDF-TrFE-CFE).

The first deformation layer 240 may be patterned using various processes, but a screen printing process and a punching process will be simply described in the current exemplary embodiment of the present invention.

According to the screen printing process, a screen printing mask having pattern through-holes corresponding to a region in which the deformation layer is formed is placed over a substrate, and the organic polymer material forming the deformation layer is pushed into the holes using a squeezing means. In the screen printing process, the thickness and the shape of the deformation layer are easily adjusted.

Additionally, the first deformation layer 240 may be formed by using a separately formed thin film, which is then patterned using the punching process. Thus patterned first deformation layer 240 may be brought into contact with the first electrode layer 230 and the first insulating layer 231.

Alternatively, the first deformation layer 240 may be formed using a photosensitive polymer.

Figure 2E:
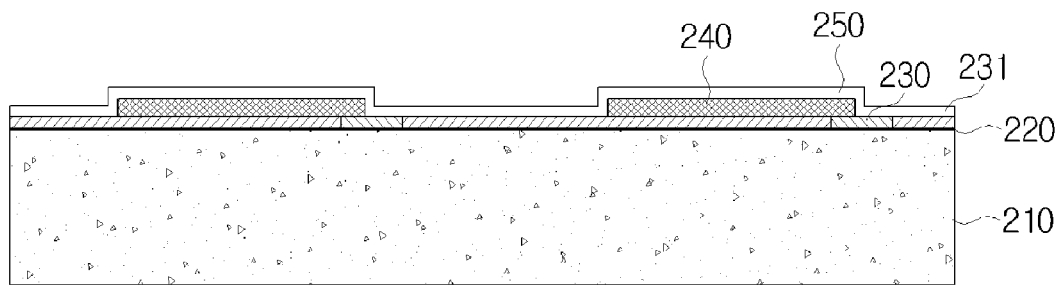

Subsequently, a second PANI layer 250 is formed by applying a liquid PANI of the formula of FIG. 3B to the first electrode layer 230, the first insulating layer 231 and the first deformation layer 240, which are exposed, as shown in FIG. 2E.

Figure 2F:
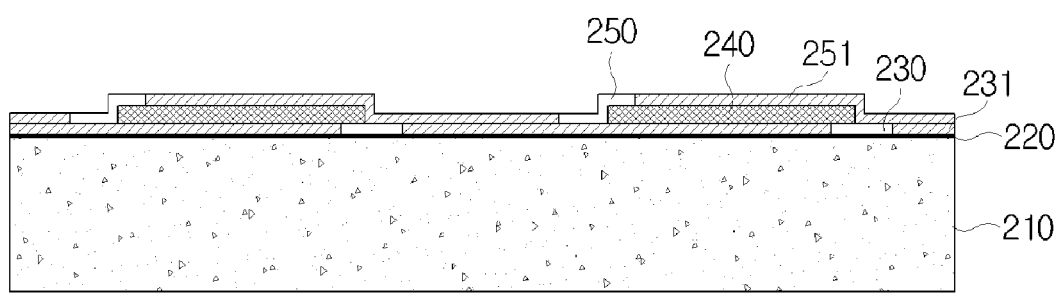

As shown in FIG. 2F, the second PANI layer 250 is patterned to give a second electrode layer 251 and a second insulating layer 250. In other words, the second electrode layer 251 and second insulating layer 250 may be formed by selectively exposing the non-conductive second PANI layer 250 to UV rays. A process for patterning the second PANI layer 250 is performed in the same manner as the process shown in FIG. 2C, so a detailed description thereof is omitted.

Figure 2G:
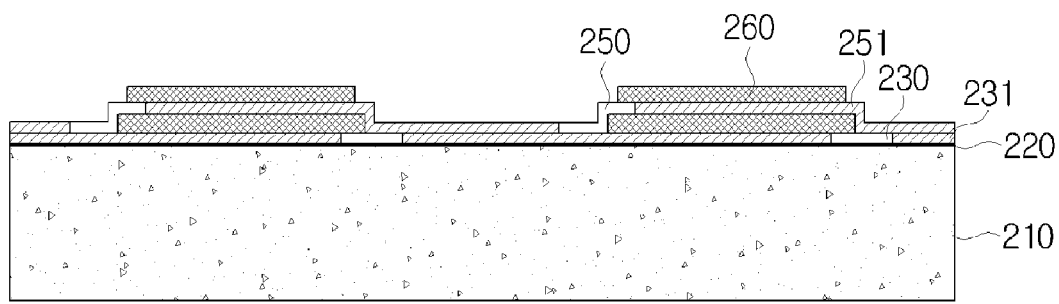

In FIG. 2G, a second deformation layer 260 is formed so as to be in contact with both of the second electrode layer 251 and the second insulating layer 250. A process for forming the second deformation layer 260 is performed in the same manner as in the process for forming the first deformation layer 240, shown in FIG. 2D, so a detailed description thereof is omitted.

Figure 2H:
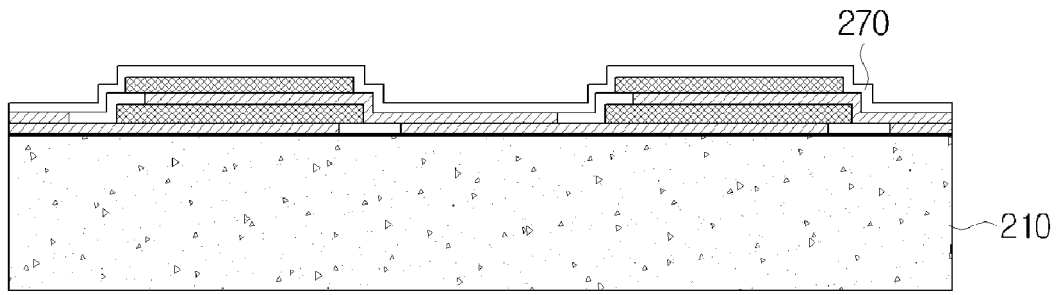

Subsequently, as shown in FIG. 2H, a third PANI layer 270 is formed by coating a liquid PANI of the formula of FIG. 3B onto the second electrode layer 251, the second insulating layer 250 and the second deformation layer 260, which are exposed.

Figure 2I:
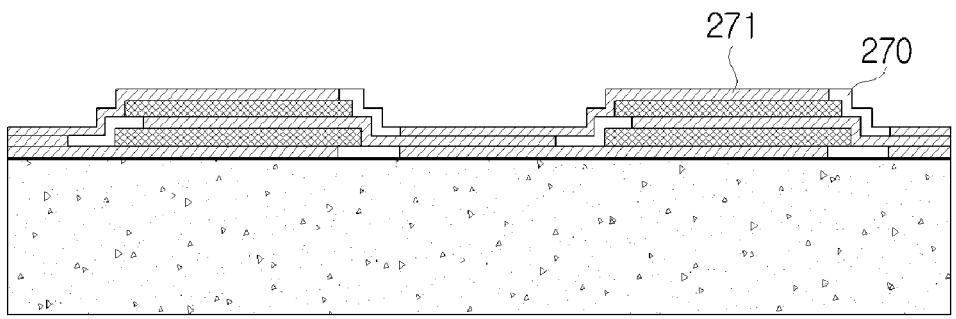

In FIG. 2I, the third PANI layer 270 is patterned to give a third electrode layer 271 and a third insulating layer 270.

Specifically, the third electrode layer 271, which is a conductive region of the third PANI layer 270, and third insulating layer 270, which is a non-conductive region, may be formed by selectively exposing the non-conductive third PANI layer 270 to UV rays. A process for patterning the third PANI layer 270 is performed in the same manner as in the process for patterning the first PANI layer 230 shown in FIG. 2C, so a detailed description thereof is omitted.

Figure 2J:
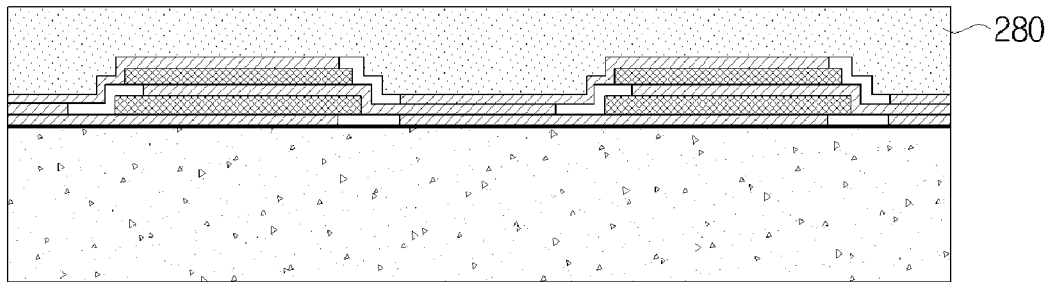

As shown in FIG. 2J, a support layer 280 is formed to coat the third electrode layer 271 and the third insulating layer 270.

Figure 2K:
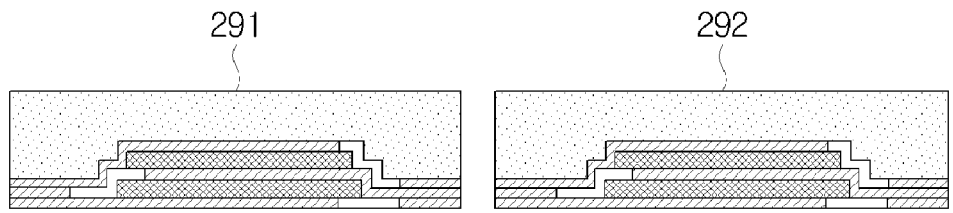

The substrate 210 is then removed as shown in FIG. 2K, and a resulting laminate structure is diced into chips (e.g., 291 and 292) each containing an EAP actuator unit and a support layer.

Alternatively, when PEDOT/PSS is used as an electrode, a region to which UV rays are irradiated becomes electrically conductive, as opposed to a situation when PANI is used as an electrode. Accordingly, If PEDOT/PSS is used, an UV-irradiated region may be differently adjusted during the step for forming an electrode layer and an insulating layer. A process for patterning PEDOT/PSS is disclosed in, for example, commonly owned co-pending U.S. application No. US20060346552, of which contents are incorporated herein by reference, so a detailed description thereof is omitted here.

Although the deformation layers which induce actuation of the actuator have a multilayer structure in the exemplary embodiment of the present invention, the deformation layers may have a multilayer structure of three or more layers.

Figure 4:
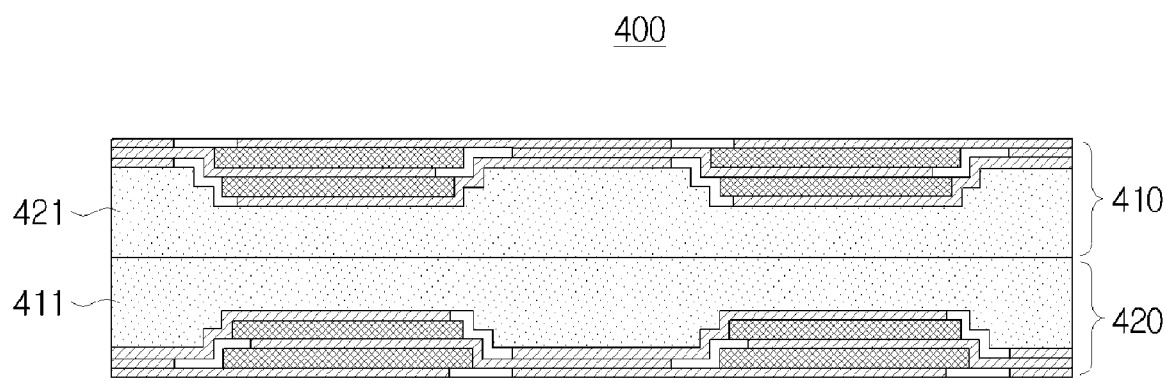
FIG. 4 is a vertical sectional view showing an electroactive polymer actuator capable of bidirectional movement.

FIG. 4 is a vertical sectional view showing an electroactive polymer actuator capable of bidirectional movement.

In FIG. 4, when support layers 411 and 412 of two electroactive polymer actuators 410 and 420 capable of moving in a single direction are laminated facing each other, an electroactive polymer actuator 400 capable of bidirectional movement may be manufactured.

Accordingly, it is possible to provide an actuator suitable for a compact mobile device.

As described above, according to the exemplary embodiment of the present invention, deformation layers have a reduced thickness and are configured in a multilayer structure. Therefore, it is possible to reduce a driving voltage while maintaining the performance of the actuator.

Additionally, if a conductive polymer is used as an electrode, it is possible to prevent a delamination phenomenon occurring between a deformation layer and a metal electrode when the metal electrode is used.

Furthermore, if a conductive polymer is used as an electrode, it is also possible to reduce interference with the strain of a deformation layer by a metal electrode caused by a thin deformation layer Moreover, an electrode comprises PANI or PEDOT/PSS capable of being patterned, so several actuators may be manufactured at one time.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An electroactive polymer actuator comprising:
   an actuator unit comprising a plurality of deformation layers, at least one deformation layer in laminated form being disposed over another deformation layer in laminated form; and
   a support layer which supports the actuator unit,
   wherein the actuator unit provides displacement corresponding to a voltage when the voltage is applied to the actuator unit.

2. The electroactive polymer actuator as claimed in claim 1, wherein the actuator unit comprises a plurality of electrode layers and the electrode layers and the deformation layers are disposed in alternatively laminated form, and the electrode layers provide the voltage to the deformation layers.

3. The electroactive polymer actuator as claimed in claim 2, wherein at least one of the plurality of electrode layers comprises a conductive polymer.

4. The electroactive polymer actuator as claimed in claim 2, wherein the actuator unit further comprises a plurality of insulating layers which are disposed on one side of the plurality of deformation layers.

5. The electroactive polymer actuator as claimed in claim 2, wherein at least one of the plurality of electrode layers is formed of a polyaniline or poly(3,4-ethylenedioxythiophene)/poly(styrenesulfonate), which is patterned.

6. The electroactive polymer actuator as claimed in claim 4, wherein a part of each deformation layer is in contact with at least one of the electrode layers and another part of the each deformation layer is in contact with at least one of the insulating layers.

7. The electroactive polymer actuator as claimed in claim 2, wherein the actuator unit is configured such that:
   if a positive voltage is applied to every other two layers of the plurality of electrode layers, and a negative voltage is applied to an electrode layer disposed between the every other two layers and insulated from the every other two layers; and
   if a negative voltage is applied to the every other two layers of the plurality of electrode layers, and a positive voltage is applied to the electrode layer disposed between the every other two layers.

8. The electroactive polymer actuator as claimed in claim 2, wherein the actuator unit comprises:
   a first electrode layer which is a lowermost layer of the actuator unit;
   a first deformation layer disposed on the first electrode layer;
   a second electrode layer disposed on the first deformation layer;
   a second deformation layer disposed on the second electrode layer; and
   a third electrode layer, disposed on the second deformation layer, which is an uppermost layer of the actuator unit,
   wherein the first electrode layer and the third electrode layer are connected to each other, and insulated from the second electrode layer.

9. The electroactive polymer actuator as claimed in claim 8, wherein if a positive voltage is applied to the first electrode layer and the third electrode layer, a negative voltage is applied to the second electrode layer, and
   wherein if a negative voltage is applied to the first electrode layer and the third electrode layer, a positive voltage is applied to the second electrode layer.

10. The electroactive polymer actuator as claimed in claim 2, wherein a thickness of each of the deformation layers ranges approximately 0.5 to 20 µm, and a thickness of each of the plurality of electrode layers ranges approximately 1/10 times of the thickness of the each of the deformation layers.

11. The electroactive polymer actuator as claimed in claim 10, a thickness of the actuator unit ranges approximately 50 to 100 µm.

12. The electroactive polymer actuator as claimed in claim 10, a thickness of the actuator unit ranges approximately 50 to 100 µm.

13. The electroactive polymer actuator as claimed in claim 3, wherein an uppermost electrode layer of the plurality of electrode layer is formed of a metal.

14. The electroactive polymer actuator as claimed in claim 1, wherein the plurality of deformation layers comprise a dielectric polymer.

15. The electroactive polymer actuator as claimed in claim 1, wherein the support layer comprises an inactive polymer.

16. The electroactive polymer actuator as claimed in claim 1, wherein the dielectric polymer is a silicone elastomer or acrylate elastomer.

17. The electroactive polymer actuator as claimed in claim 1, wherein the plurality of deformation layers comprise a ferroelectric polymer.

18. The Electroactive polymer actuator as claimed in claim 17, wherein the ferroelectric polymer is a polyvinylidene fluoride or polyvinylidene fluoride-trifluoroethylene.

19. The electroactive polymer actuator as claimed in claim 17, wherein the ferroelectric polymer is a poly(vinylidene fluoride-trifluoroethylene-chlorofluoroethylene).

20. The electroactive polymer actuator as claimed in claim 1, wherein when the voltage is applied, the displacement forms a concave part on a bottom surface of the actuator unit while a top surface of the actuator unit is supported by the support layer.

21. The electroactive polymer actuator as claimed in claim 1, wherein, among two of the plurality of deformation layers, a length of a deformation layer is greater than a length of another deformation layer if the former is disposed over the latter.

* * * * *